United States Patent [19]
McCall et al.

[11] Patent Number: 6,147,531
[45] Date of Patent: Nov. 14, 2000

[54] SAMPLED DELAY LOCKED LOOP INSENSITIVE TO CLOCK DUTY CYCLE

[75] Inventors: Kevin J. McCall, Leominster; Janos Kovacs, North Andover, both of Mass.

[73] Assignee: Analog Devices, Inc., Norwood, Mass.

[21] Appl. No.: 09/112,889

[22] Filed: Jul. 9, 1998

[51] Int. Cl.[7] .................................................. H03L 7/06
[52] U.S. Cl. ........................ 327/158; 327/147; 327/263
[58] Field of Search ................................ 327/147, 148, 327/149, 150, 151, 152, 153, 154, 155, 156, 157, 158, 159, 160, 263; 331/1 A, 25; 375/376

[56] References Cited

U.S. PATENT DOCUMENTS

| | | |
|---|---|---|
| 4,338,569 | 7/1982 | Petrich ..................................... 328/155 |
| 5,220,206 | 6/1993 | Tsang et al. ........................... 307/296.3 |
| 5,537,069 | 7/1996 | Volk ......................................... 327/149 |
| 5,574,756 | 11/1996 | Jeong ....................................... 375/376 |
| 5,663,665 | 9/1997 | Wang et al. ................................. 327/3 |
| 5,764,092 | 6/1998 | Wada et al. .............................. 327/271 |
| 5,777,567 | 7/1998 | Murata et al. ...................... 341/100.95 |
| 5,880,612 | 3/1999 | Kim ......................................... 327/158 |
| 5,883,534 | 3/1999 | Kondoh et al. .......................... 327/156 |
| 5,952,857 | 9/1999 | Suzuki ..................................... 327/149 |

*Primary Examiner*—Terry D. Cunningham
*Assistant Examiner*—Quan Tra
*Attorney, Agent, or Firm*—Kirk Teska; Iandiorio & Teska

[57] ABSTRACT

A write channel in read/write disc drive system for writing data signals to a drive includes a variable delay circuit having a number of selectable taps for correcting for non-linear transition shift; and a delay locked loop circuit responsive to the data signal for controlling the delay of the variable circuit.

9 Claims, 5 Drawing Sheets

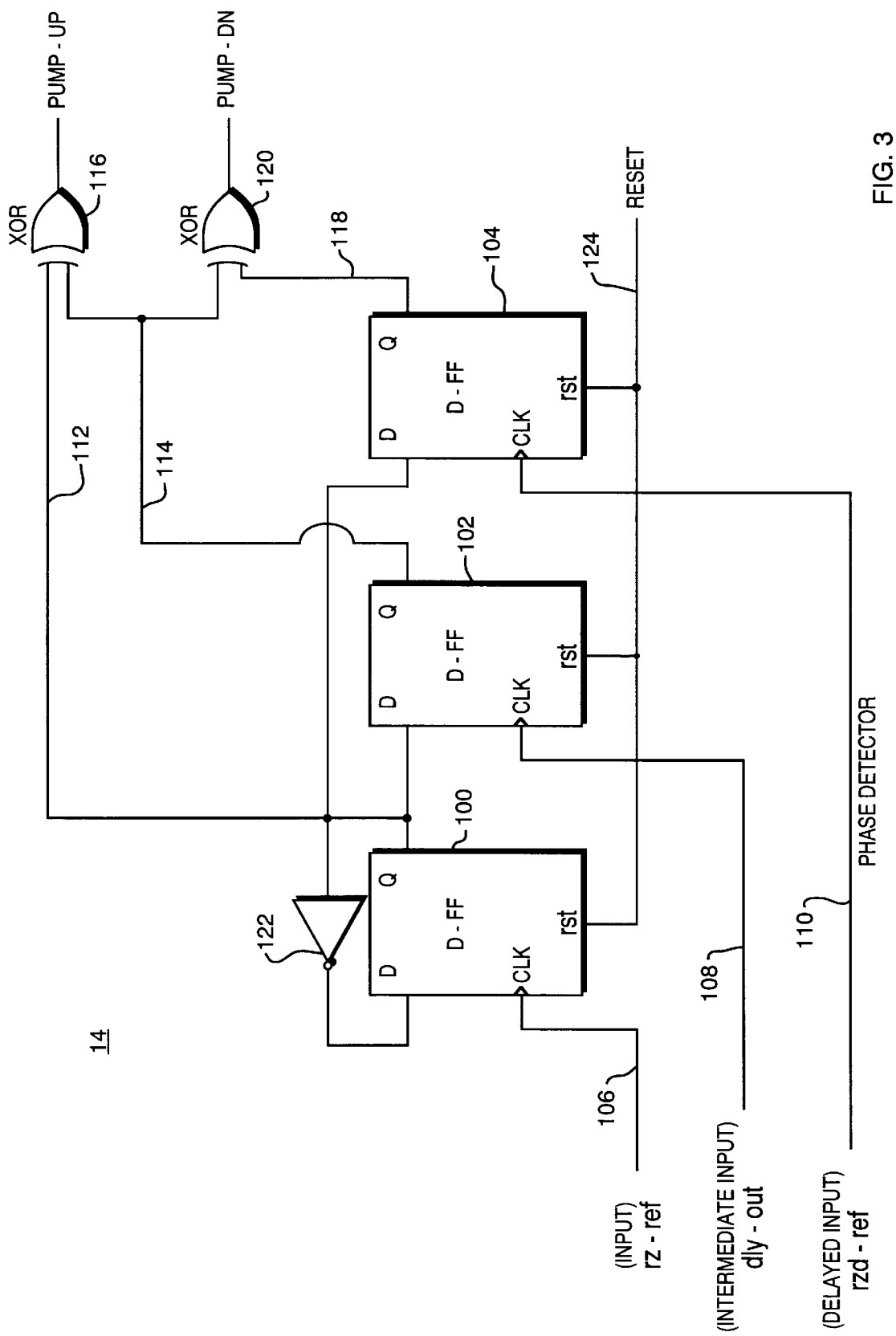

SAMPLED DELAY LOCKED LOOP INSENSITIVE TO CLOCK DUTY CYCLE

FIELD OF INVENTION

This invention relates to an improved write channel for a read/write disc drive system, and more particularly to a sampled delay locked loop insensitive to clock duty cycle for correcting for non-linear transition shift.

BACKGROUND OF INVENTION

During the writing process in disc drivers there occurs the problem of non-linear transition shift (NLTS). This causes the actual pulse edge transition which switches the magnetic domain of the magnetic media to shift early by as much as 30%. The extent of the shift varies with the media and/or components such as the write coil. Thus each manufacturer must tune the equipment to optimize the reduction of the shift. In one conventional approach an open loop delay line with a number of taps in 2% increments is used to provide the manufacturer with a selection to choose the necessary delay for his particular configuration of media and components. This open loop approach does not provide feedback to adjust for changes in the environment that can offset the shift.

SUMMARY OF INVENTION

It is therefore an object of this invention to provide an improved write channel for a read/write disc drive system for writing data signals to a disc.

It is a further object of this invention to provide such a write channel which employs a delay locked loop.

It is a further object of this invention to provide such a write channel in which a delay locked loop is employed to control the overall delay of a variable delay circuit having a number of taps.

It is a further object of this invention to provide such a write channel which corrects for non-linear transition shift.

It is a further object of this invention to provide such a write channel which corrects for non-linear transition shift over a wide range of ambient conditions and manufacturing variability.

It is a further object of this invention to provide an improved sampled delay locked loop insensitive to clock duty cycle.

Present systems for adjusting for non-linear transition shift errors (NLTS) are generally open-loop. These systems work well initially to correct for NLTS but the correctional delay provided varies due to environmental conditions and may become more or less than required because in open loop circuits there is no feedback to adjust to the changing conditions. To solve this problem a closed loop is proposed but suffers from sensitivity to clock duty cycle because the return to zero (rz) data has a duty cycle which is also subject to variation due to ambient conditions or manufacturing variability. Errors of any sort are difficult to tolerate because the delays required to compensate for NLTS may be as small as 50 picoseconds.

The invention results from the realization that a delay locked loop circuit can be used to overcome NLTS in spite of the variation in clock duty cycle by using the only well defined and invariable master clock period to control an integrator which controls the total delay of a multistop variable delay circuit whose taps are selectable to correct for NLTS.

This invention features a sampled delay locked loop insensitive to clock duty cycle including an input terminal for receiving an input signal; a clock cycle delay circuit for delaying the input signal by at least one clock cycle to produce a delayed input signal; and a variable delay circuit for delaying the input signal intermediate the input signal and delayed input signal to produce an intermediate input signal. There is an integrator circuit and an edge detector circuit, responsive to the input signal to drive the integrator circuit to integrate in a first direction, responsive to the intermediate input signal to drive the integrator circuit to integrate in a second direction and responsive to the delayed input signal to end the integration. The variable delay circuit is responsive to the integrator circuit to vary the time of occurrence of the intermediate input signal and the reversal of the integration direction for achieving a zero sum integration.

In a preferred embodiment the integrator circuit may include a charge pump and a capacitor. The variable delay circuit may include a number of delay taps. There may be a sample and hold circuit. The sample and hold circuit may include storage means, switch means for interconnecting the sample and hold circuit and the integrator circuit, and an actuator means for selectively operating the switch means. There may be a decimate circuit for periodically disabling the actuator means. The edge detector may include a first edge trigger flip-flop circuit for providing a first output in response to the input signal, a second edge trigger flip-flop circuit for providing a second output in response to the intermediate input signal, and a third edge trigger flip-flop responsive to the delayed input signal for providing a third output, a first exclusive OR circuit responsive to the first and second outputs to drive the integration in the first direction and a second exclusive OR circuit responsive to the second and third outputs to drive the integration in the second, opposite direction. The second and third edge trigger flip-flop circuits may receive their input from the output of the first edge trigger flip-flop circuit.

The invention also features a write channel in a read/write disc drive system for writing data signals to a disc including a variable delay circuit having a number of selectable taps for correcting for non-linear transition shift and a delay locked loop circuit responsive to the data signal for controlling the delay of the variable delay circuit.

In a preferred embodiment the delayed locked loop circuit may include an input terminal for receiving a data signal; a clock cycle delay circuit for delaying the data signal by at least one clock cycle to produce a delayed data signal, and a variable delay circuit for delaying the data signal intermediate the data signal and delayed data signal to produce an intermediate data signal. There may also be an integrator circuit and an edge detector circuit responsive to the data signal to drive the integrator circuit to integrate in a first direction responsive to the intermediate data signal to drive the integrator to integrate in a second, opposite direction and responsive to the delayed data signal to end the integration. The variable delay circuit may be responsive to the integrator circuit to vary the time of occurrence of the intermediate data signal and the reversal of the integration direction for achieving a zero sum integration.

DISCLOSURE OF PREFERRED EMBODIMENT

Other objects, features and advantages will occur to those skilled in the art from the following description of a preferred embodiment and the accompanying drawings, in which:

FIG. 3 is a more detailed schematic block diagram of the edge detector of FIG. 1.

Figure 1:
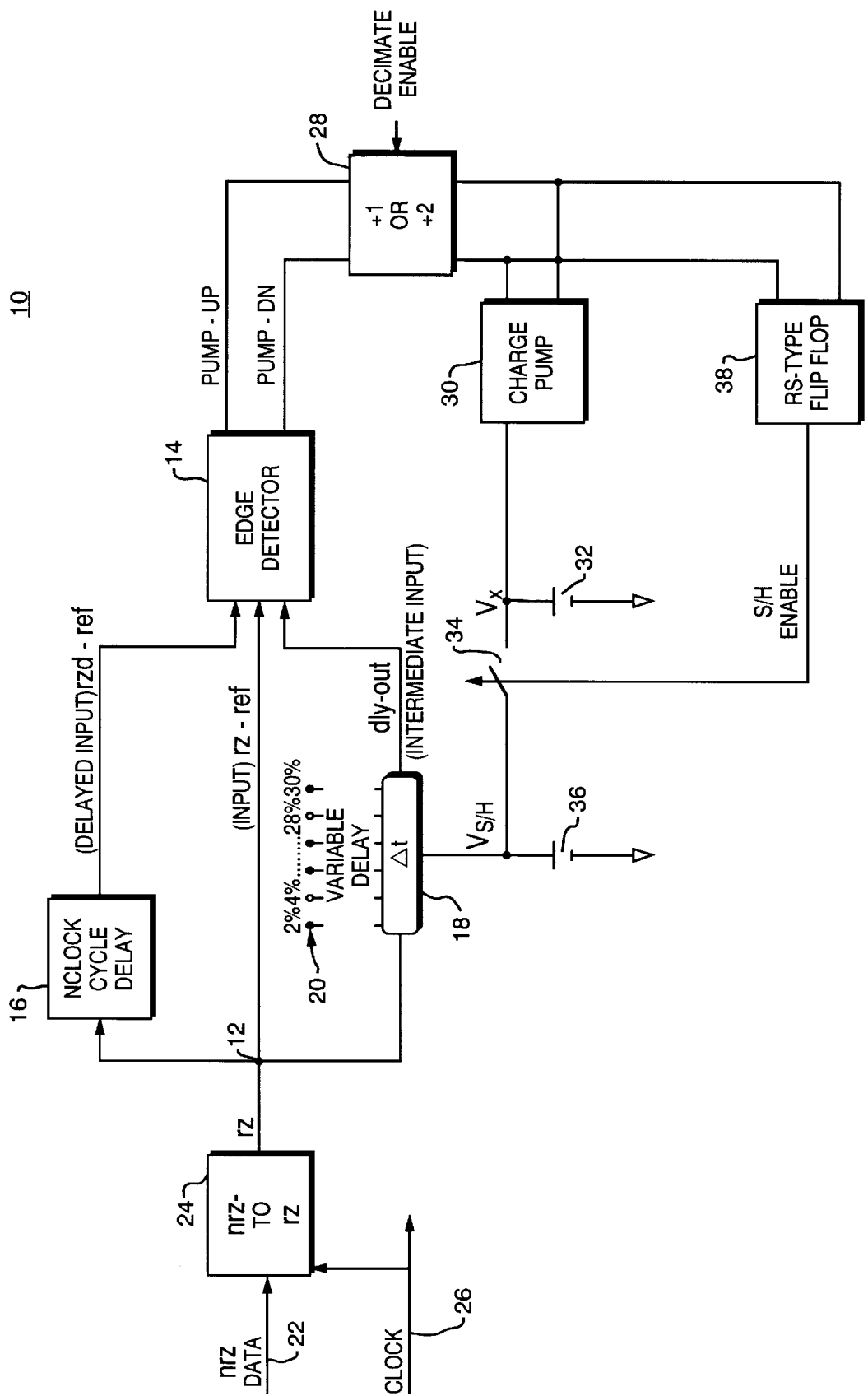
FIG. 1 is a schematic block diagram of write channel including a delay locked loop circuit insensitive to clock duty cycle according to this invention.

There is shown in FIG. 1 a portion of a write channel 10 using a sampled delay locked loop circuit insensitive to clock duty cycle according to this invention. The input signal, in the form of return-to-zero (rz) data, is presented at input terminal 12 and is presented as a return-to-zero reference (rz-ref) signal to edge detector 14. The return-to-zero rz signal is also delivered to N clock cycle delay circuit 16 which operates to delay the signal by one or more clock cycles, typically one, and presents the delayed input signal in the form of rz delayed reference signal (rzd-ref) as a second input to edge detector 14. The same input signal is also delivered to the variable tapped delay circuit 18 which introduces a variable delay into the circuit that may be tapped in two percent increments at taps 20.

If the incoming data is not in the return-to-zero (rz) form but in the non-return-to-zero (nrz) form, as often may be the case, the nrz data is converted to rz data in converting circuit 24 which also receives the master clock input 26. The non-return-to-zero data form is not preferred because of the high precision, as small as 50 picoseconds, required to adjust for the NLTS. The positive and negative transitions of an nrz data pulse do not precisely mirror one another and so it is difficult to obtain the necessary precision. The rz data form does not have this problem but introduces another problem because its negative transition time can vary, but this is accommodated for in this invention through the use of the N clock cycle delay circuit 16 which utilizes the positive transition of the next pulse to define the end of the first pulse thereby being insensitive to any variation in the clock duty cycle. Edge detector 14 begins to pump up (or pump down) when it receives the input signal rz-ref directly from terminal 12. When it receives the intermediate input signal dly-out from variable tap delay line 18 it reverses direction and produces a pump down (or pump up) signal. Upon the occurrence of the delayed input signal rzd-ref from N clock cycle delay circuit 16, the integration is stopped.

Thus ignoring for the moment decimate circuit 28, charge pump 30 is driven up (or down) and then down (or up) in accordance with the output of edge detector 14. This causes charge pump 30 to increase or decrease the voltage $V_x$ on capacitor 32. When switch 34 is closed the voltage $V_x$ accumulated on capacitor 32 is transferred to storage capacitor 36 and thereupon applied to the input of variable tap delay line 18. Since delay line 18 is a voltage control variable delay line its overall delay varies in accordance with the voltage applied to it. Any variation in the overall delay introduced by delay line 18 causes a shift of the point where detector 14 switches between the pump up and pump down directions. This shift is seen as an increase or decrease in voltage $V_x$ and thus is returned to readjust the delay of the delay line 18, so that regardless of variations in environmental conditions the total delay always remains the same. Thus the taps at, for example, 2% increments from 2–30% will always be precise since the overall delay is kept constant.

Switch 34 is opened and closed in accordance with instructions from driver 38 which may, for example, be an RS type flip-flop that provides the S/H enable signal to operate switch 34. Flip-flop 38 is controlled by a signal from the decimate circuit 28 which is shown as having a divide-by-1 or a divide-by-2 capacity, although the divide-by-2 capacity could be any desired number. When decimate circuit 28 is in a divide-by-1 mode it permits flip-flop 38 to operate switch 34 on every data signal, whereas in the other mode, divide-by-2, divide-by-3, divide-by-4, . . . , flip-flop 38 operates switch 34 only upon the occurrence of very second, third fourth, . . . , data input signal, as will be further understood with reference to FIG. 2.

Figure 2A:
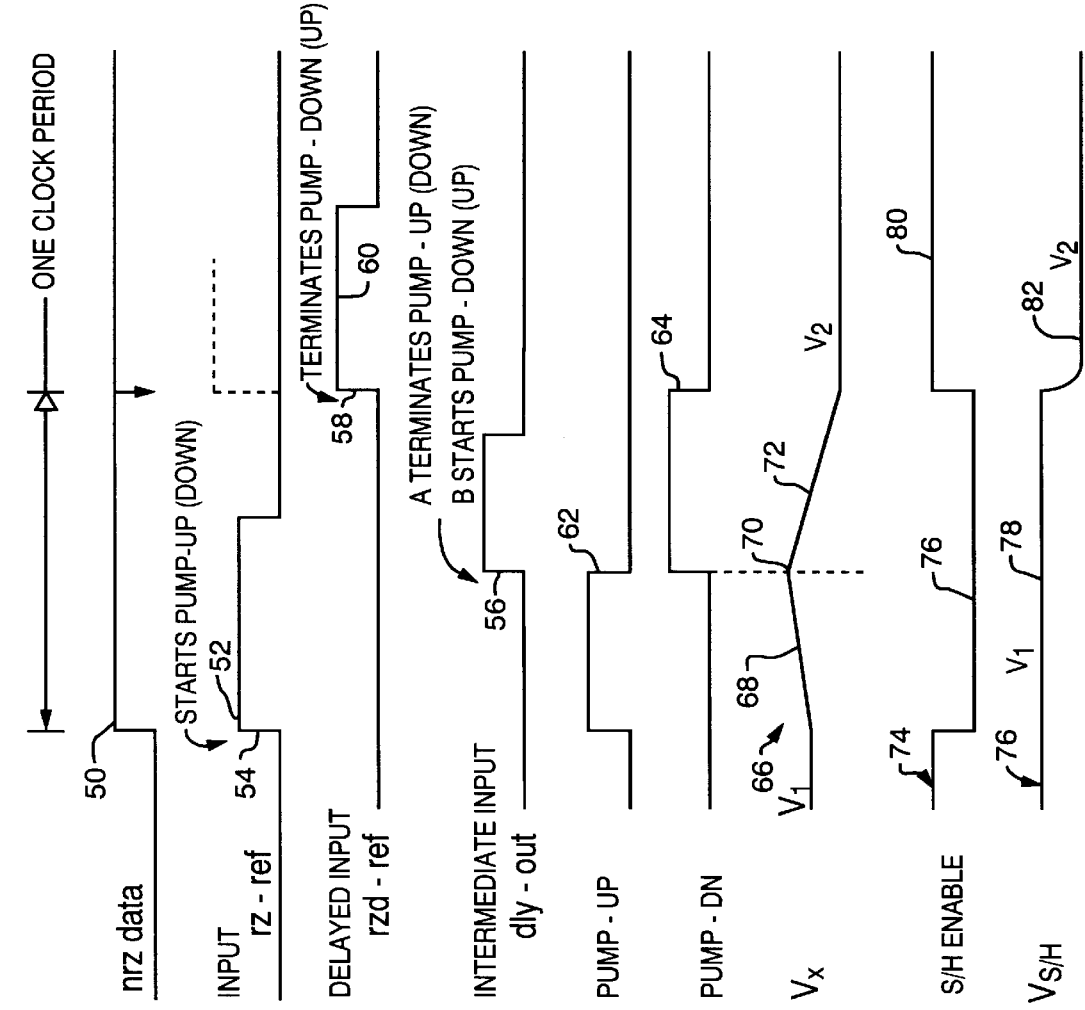
FIGS. 2A and 2B illustrate a series of waveforms that occur in the circuit of FIG. 1.
Figure 2B:
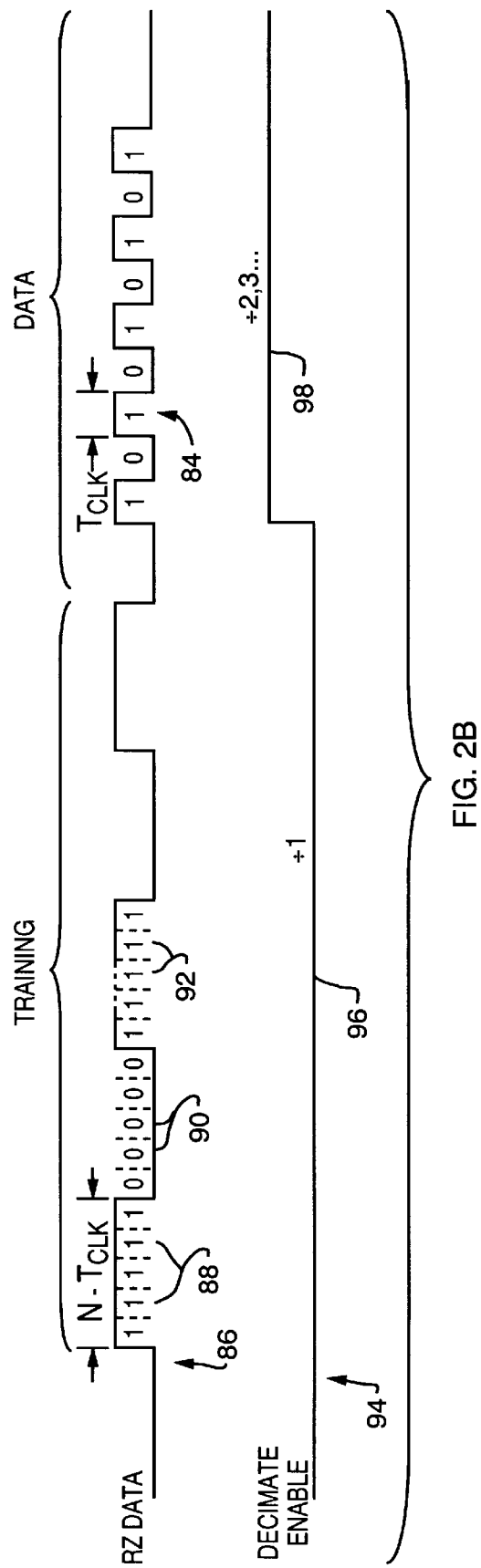

Assuming an input of nrz data, signal 50, FIG. 2, converter 24 converts that to the input signal rz-ref 52, which exhibits positive transition 54, and starts the pump up or down signal. Delay line 18 produces the intermediate input dly-out 56, which terminates the pump up or down and starts the pump down or up. Precisely at the end of clock period the input rz-ref, which has been delayed by N clock cycle delay circuit 16 (by one clock cycle in this embodiment) to become delayed input rzd-ref 58, at its positive edge terminates the pump down or up. Thus the clock period has been defined precisely in accordance with the master clock period using the positive-going transition of the input signal 52 and the positive transition 58 of the delayed rzd-ref input signal 60, thereby making the system completely insensitive to the clock duty cycle and removing that source of ambiguity and error normally present in rz data signals.

The pump up signal 62 and pump down signal 64 cause the voltage $V_x$ on capacitor 32 to produce a waveform 66 which first rises 68 during the pump up signal, then switches at point 70 upon the occurrence of dly-out transition 56 to integrate in the first direction 68 and then reverse and integrate in the second direction 72. The inequality between the starting voltage $V_1$ and the ending voltage $V_2$ is an indication that the conditions have caused the total delay to shift somewhat. The difference in voltage created when delivered to variable delay line 18 causes it to adjust its overall delay in order to maintain that delay designed into it and thereby maintain the precision of the 2% –30% delay taps. The S/H enable signal 74 goes low 76 during the integration period so that switch 34 is open. This prevents a voltage being applied to delay line 18 and possibly varying its delay while a data signal is actually going through it. Thus the voltage $V_{S/H}$ 76 remains constant at the $V_1$ level 78 for the entire time the data pulse is going through. Then when the S/H enable signal goes high 80 closing switch 34, the new voltage level 82 $V_2$ can be applied without causing a variation in delay while the data signal is coursing through delay line 18.

It can be seen that a series of alternating ones and zeroes, as indicated at 84 in FIG. 2, would cause the S/H enable signal to constantly keep switch 34 in the open position. This opens the feedback loop and so the voltage $V_x$ would continue to decrease or increase because the signal cannot reach delay line 18 to correct for the shift in time. Then when the data pattern changes to a series of ones or a series of zeros, the entire corrective buildup (which would be in error) would be applied to delay line 18 and seriously impair the operation of the entire system. In order to avoid this, decimate circuit 28 is employed to provide a divide-by-2 (or more) mode in which flip-flop 38 is caused to definitely close switch 34 periodically in order to properly update voltage $V_{SH}$ on capacitor 36. The divide-by-1 mode of decimate circuit 28 is used during the training circuit which is used to monitor and adjust for the NLTS in the write channel when there is no call for writing to the disc. The training signal 86 typically provides a number of ones 88 followed by a number of zeros 90 followed by a number of ones again 92, and so on; so in that mode the switch will not be hung up in the open position in the divide-by-1 mode, i.e., a direct pass-through can be effected. The decimate signal 94 would remain at a low level 96 in a divide-by-1 mode during the entire training cycle and would switch to level 98 in a divide-by-2, 3, . . . mode.

Edge detector 14, FIG. 3, may include three D type flip-flops 100, 102, 104, which are clocked to pass the signal at their input D to their output Q by the input signal rz-ref 106, the intermediate input signal dly-out 108 and the delayed input rzd-ref 110. The Q outputs 112, 114 of flip-flops 100 and 102 provide inputs to exclusive OR circuit 116 while the Q outputs 114 and 118 of flip-flops 102 and 104 provide the inputs to exclusive OR gate 120. Exclusive OR gate 116 has been designated the pump up gate and exclusive OR gate 120 is the pump down gate, but as indicated throughout the specification, the system can pump up and then down, or down and then up. The order in which the integrator operates is not critical to the invention. Note the output of flip-flop 100 provides the input to flip-flop 102 and flip-flop 104 as well as to its own input through inverter 122.

In operation, after a reset signal has been sent on reset line 124 the Q outputs of all flip-flops is zero. Thus the output of inverter 122 is 1 and the D input to flip-flop 100 is 1. Upon the occurrence of input signal 106 at the clock input of flip-flop 100 it changes state so that its output becomes a 1. There is now a 1 present at the D input of flip-flop 102 and at the D input of flip-flop 104. The 1 at the Q output of flip-flop 100 is also supplied on line 112 to exclusive OR circuit 116, whose other input 114 is still at 0. Thus exclusive OR gate 116 provides the pump up signal. Subsequently, when the intermediate signal dly-out occurs on line 108, the 1 at input D of flip-flop 102 is clocked through to the output Q, so the Q output now becomes a 1. With a 1 on line 114, exclusive OR 116 has a 1 on both inputs and so the pump up signal ceases. However, exclusive OR gate 120 now has a 1 on line 114 but a 0 on line 118, so the pump down operation begins. Subsequently, when the delay input rzd-ref on 110 occurs at clock input flip-flop 104, the 1 at its input D is passed through to the Q output on line 118 and since exclusive OR gate 120 now sees two 1's at its input, the pump down operation ceases.

Figure 4:
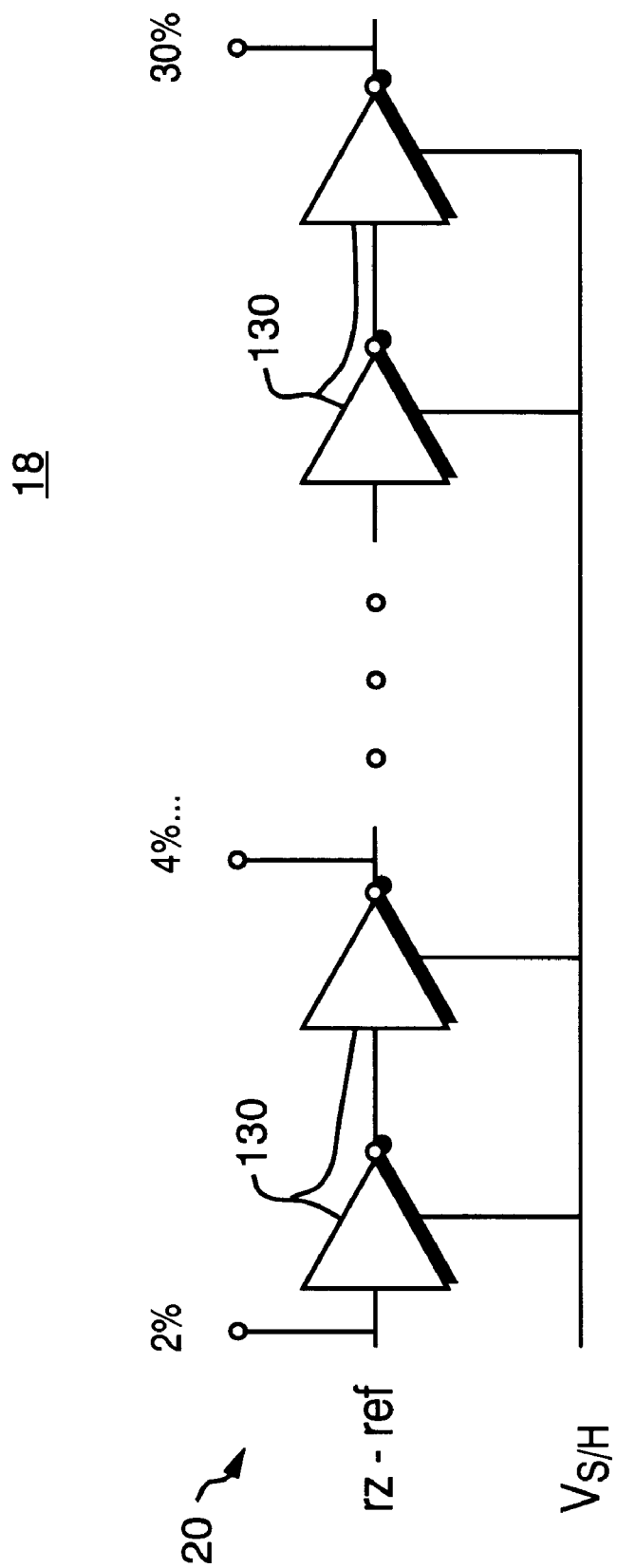
FIG. 4 is a detailed schematic block diagram of the variable tapped delay circuit of FIG. 1.

Variable tap delay line 18, FIG. 4, may include a series of inverter amplifiers 130 paired to provide delays at taps 20 of 2%, 4%, . . . , 28%, 30%.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A sampled delay locked loop insensitive to clock duty cycle comprising:
   an input terminal for receiving an input signal;
   a clock cycle delay circuit for delaying said input signal by at least one clock cycle to produce a delayed input signal;
   a variable delay circuit for delaying the input signal intermediate said input signal and delayed input signal to produce an intermediate input signal;
   an integrator circuit; and
   an edge detector circuit responsive to the input signal to drive the integrator circuit to integrate in a first direction, responsive to the intermediate input signal to drive the integrator circuit to integrate in a second direction and responsive to the delayed input signal to end the integration; said variable delay circuit being responsive to said integrator circuit to vary the time of occurrence of the intermediate data signal and the reversal of the integration direction for achieving a zero sum integration.

2. The sampled delay locked loop insensitive to clock duty cycle of claim 1 in which said integrator circuit includes a charge pump and a capacitor.

3. The sampled delay locked loop insensitive to clock duty cycle of claim 1 in which said variable delay circuit includes a number of delay taps.

4. The sampled delay locked loop insensitive to clock duty cycle of claim 1 in which said variable delay circuit includes a sample and hold circuit.

5. The sampled delay locked loop insensitive to clock duty cycle of claim 4 in which said sample and hold circuit includes storage means, switch means for interconnecting said sample and hold circuit and said integrator circuit, and actuator means for selectively operating said switch means.

6. The sampled delay locked loop insensitive to clock duty cycle of claim 5 in which said sample and hold circuit includes a decimate circuit for periodically disabling said actuator means.

7. The sampled delay locked loop insensitive to clock duty cycle of claim 1 in which said edge detector includes a first edge trigger flip flop circuit for providing a first output in response to the input signal, a second edge trigger flip flop circuit for providing a second output in response to said intermediate input signal and a third edge trigger flip flop responsive to said delayed input signal for providing a third output, a first exclusive OR circuit responsive to said first and second outputs to drive the integration in the first direction and a second exclusive OR circuit responsive to said second and third outputs to drive the integration in the second, opposite direction.

8. The sampled delay locked loop insensitive to clock duty cycle of claim 7 in which said second and third edge trigger flip flop circuits receive an input from the output of said first edge trigger flip flop circuit.

9. A system for writing data signals to a disk comprising:
   a delay locked loop circuit, said delay locked loop circuit further comprising:
      a variable delay circuit having a number of selectable taps for correcting for non-linear transition shift;
      an input terminal for receiving a data signal;
      a clock cycle delay circuit for delaying said data signal by at least one clock cycle to produce a delayed data signal;
      wherein said variable delay circuit is operative for delaying the data signal intermediate said data signal and delayed data signal to produce an intermediate data signal;
      an integrator circuit; and
      an edge detector circuit, responsive to the data signal to drive the integrator circuit to integrate in a first direction, responsive to the intermediate data signal to drive the integrator circuit to integrate in a second, opposite direction and responsive to the delayed data signal to end the integration; said variable delay circuit being responsive to said integrator circuit to vary the time of occurrence of the intermediate data signal and the reversal of the integration direction for achieving a zero sum integration.

* * * * *